(12) United States Patent
Lee et al.

(10) Patent No.: US 11,396,030 B2
(45) Date of Patent: Jul. 26, 2022

(54) MASK FRAME ASSEMBLY FOR DEPOSITING THIN FILM

(71) Applicant: Samsung Display Co., Ltd., Yongin-Si (KR)

(72) Inventors: Jongdae Lee, Yongin-si (KR); Yalim Kim, Yongin-si (KR); Youngeun Ryu, Yongin-si (KR); Sangheon Jeon, Yongin-si (KR)

(73) Assignee: Samsung Display Co., Ltd.

( * ) Notice: Subject to any disclaimer, the term of this patent is extended or adjusted under 35 U.S.C. 154(b) by 23 days.

(21) Appl. No.: 16/533,709

(22) Filed: Aug. 6, 2019

(65) Prior Publication Data

US 2020/0238328 A1    Jul. 30, 2020

(30) Foreign Application Priority Data

Jan. 24, 2019    (KR) ........................ 10-2019-0009237

(51) Int. Cl.
*B05C 21/00*    (2006.01)
*C23C 14/04*    (2006.01)
(Continued)

(52) U.S. Cl.
CPC ............ *B05C 21/005* (2013.01); *B05C 17/06* (2013.01); *C23C 14/04* (2013.01); *C23C 14/042* (2013.01);
(Continued)

(58) Field of Classification Search
CPC ....... B05C 21/005; B05C 17/06; C23C 14/04; C23C 14/042; C23C 14/24; C23C 16/042;
(Continued)

(56) References Cited

U.S. PATENT DOCUMENTS 9,284,638 B2    3/2016 Ko et al.
9,859,495 B2    1/2018 Kang
(Continued)

FOREIGN PATENT DOCUMENTS

KR    10-2010-0026655 A    3/2010
KR    10-2017-0026960 A    3/2017
(Continued)

*Primary Examiner* — Laura Edwards
(74) *Attorney, Agent, or Firm* — Innovation Counsel LLP (57) ABSTRACT

A mask frame assembly includes: a mask frame; at least one mask sheet arranged on the mask frame; a plurality of first support sticks extending in a first direction; and a plurality of second support sticks extending in a second direction, wherein a mask frame transformation index is within a range from about −1000 to about +1000 based on mask frame transformation index=Σ (tensile force of first support sticks/tensile rate of first support sticks)−Σ (tensile force of second support sticks/tensile rate of second support sticks), where tensile force of respective first or second support stick is given by thickness (T)×width (W)×elastic coefficient (E)× tensile rate ($\delta/L_0$), $\delta$ is a transformed amount ($L_f - L_0$) corresponding to tension, $L_0$ is an initial length of respective first or second support stick, and $L_f$ is a final length of respective first or second support stick.

4 Claims, 6 Drawing Sheets

(51) Int. Cl.
*C23C 16/04* (2006.01)
*H01L 51/56* (2006.01)
*B05C 17/06* (2006.01)
*H01L 27/32* (2006.01)
*H01L 51/00* (2006.01)

(52) U.S. Cl.
CPC ........ *C23C 16/042* (2013.01); *H01L 27/3244* (2013.01); *H01L 51/0011* (2013.01); *H01L 51/56* (2013.01)

(58) Field of Classification Search
CPC . H01L 27/3244; H01L 51/56; H01L 51/0011; H01L 21/67017; G03F 1/66; G03F 7/70691
USPC ........ 118/504, 505, 721; D5/58, 99; D19/40
See application file for complete search history.

(56) References Cited

U.S. PATENT DOCUMENTS

| | | | |
|---|---|---|---|
| 10,147,880 | B2 | 12/2018 | Sung et al. |
| 2006/0103289 | A1* | 5/2006 | Kim ........................ B05B 12/20 |
| | | | 313/402 |
| 2010/0021829 | A1 | 1/2010 | Kang et al. |
| 2016/0122860 | A1* | 5/2016 | Kim ...................... C23C 14/042 |
| | | | 118/505 |
| 2017/0207390 | A1* | 7/2017 | Kim ........................ C23C 14/24 |
| 2017/0222145 | A1* | 8/2017 | Kim .................... H01L 51/0011 |
| 2017/0282212 | A1 | 10/2017 | Kang et al. |

FOREIGN PATENT DOCUMENTS

| | | |
|---|---|---|
| KR | 10-2017-0114025 A | 10/2017 |
| KR | 10-2018-0038093 A | 4/2018 |

\* cited by examiner

MASK FRAME ASSEMBLY FOR DEPOSITING THIN FILM

CROSS-REFERENCE TO RELATED APPLICATION

This application claims the benefit of Korean Patent Application No. 10-2019-0009237, filed on Jan. 24, 2019, in the Korean Intellectual Property Office, the disclosure of which is incorporated herein in its entirety by reference.

BACKGROUND

1. Field

One or more embodiments relate to a mask frame assembly for depositing a thin film.

2. Description of the Related Art

Generally, display devices may be used in mobile devices such as smartphones, laptop computers, digital cameras, camcorders, personal digital assistants, notebook computers, and tablet personal computers, and in electronic apparatuses such as desktop computers, televisions, outdoor billboards, display devices for exhibitions, instrument panels for automobiles, and head-up displays (HUDs).

Recently, a slimmer display device has been brought to the market. A flexible display device is easy to carry and applicable to devices of various shapes, and is bendable in at least one direction. Among them, a flexible display device based on organic light-emitting display technology is a leading type of flexible display device.

An organic light-emitting display device includes a pixel electrode, an opposite electrode, and an organic emission layer between the pixel electrode and the opposite electrode, each being arranged over a substrate. A thin film such as an organic emission layer may be formed by a deposition method. A deposition apparatus requires a mask frame assembly for forming a thin film.

However, when the number of depositions increases, a mask assembly may be thermally transformed. In the case where the mask frame assembly is thermally transformed, a deposition material may be deposited on an undesired area of a substrate. Consequently, a fine deposition pattern cannot be formed in the substrate.

SUMMARY

One or more embodiments include a mask frame assembly for depositing a thin film that may form a fine deposition pattern in a substrate.

Additional aspects will be set forth in part in the description which follows and, in part, will be apparent from the description, or may be learned by practice of the presented embodiments.

According to one or more embodiments, a mask frame assembly includes: a mask frame including an opening and a plurality of frames surrounding the opening; at least one mask sheet in which a plurality of deposition holes are patterned, the at least one mask sheet being arranged on the mask frame; a plurality of first support sticks extending in a first direction; and a plurality of second support sticks extending in a second direction, wherein a mask frame transformation index is within a range from about −1000 to about +1000 based on mask frame transformation index=Σ (tensile force of first support sticks/tensile rate of first support sticks)−Σ (tensile force of second support sticks/tensile rate of second support sticks) Here, tensile force of respective first or second support stick is given by thickness (T)×width (W)×elastic coefficient (E)×tensile rate ($\delta/L_0$), $\delta$ is a transformed amount ($L_f - L_0$) corresponding to tension, $L_0$ is an initial length of respective first or second support stick, and $L_f$ is a final length of respective first or second support stick.

A first direction of the mask frame may correspond to a direction in which the first support stick extends, and an entire change amount of the mask frame in the first direction may be 5 µm or less.

A second direction of the mask frame may correspond to a direction in which the second support stick extends, and an entire change amount of the mask frame in the second direction may be 5 µm or less.

A transformation rate of the mask frame may correspond to a transformation rate of the first support stick minus a transformation rate of the second support stick.

Restoring force of the mask frame may be proportional to Σ (tensile force of the second support sticks/Σ tensile force of the first support sticks).

The mask frame may include a first frame and a second frame that each extend in the first direction and face each other in the second direction; and a third frame and a fourth frame that each extend in the second direction and face each other in the first direction, wherein the first frame, the second frame, the third frame, and the fourth frame are connected to each other to surround the opening.

The at least one mask sheet may include a plurality of mask sheets that are separated in the first direction and each extend in the second direction.

Deposition areas and dummy areas may be alternatively arranged in the second direction in each of the mask sheets, a plurality of first pattern holes may be arranged in the deposition area, and a plurality of second pattern holes may be arranged in the dummy area.

Each deposition area separated by the dummy area may correspond to a deposition area of a unit display panel.

The first support stick may extend across the plurality of mask sheets that are adjacent in the first direction and shield the plurality of second pattern holes arranged in each of the plurality of mask sheets.

The second support stick may be arranged in a direction in which the mask sheet extends in the second direction, and arranged in a boundary area between the plurality of mask sheets that are adjacent in the first direction.

The first support stick and the second support stick may be arranged between the mask frame and the mask sheet.

The first support stick may extend across the mask sheet in the first direction, and the second support stick may extend across the mask sheet in the second direction.

The first support stick may shield at least some of the deposition holes arranged in the mask sheet, and the second support stick may overlap a rib arranged at an edge of the mask sheet.

The first support stick and the second support stick may intersect with each other.

The first support sticks may be spaced apart from each other in the second direction, and the second support sticks may be spaced apart from each other in the first direction.

The first direction may correspond to a width direction of the mask sheet, and the second direction may correspond to a lengthwise direction of the mask sheet.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

It will be understood that when a layer, region, or component is referred to as being "formed on" another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, a mask frame assembly for depositing a thin film according to an embodiment is described in detail with reference to the accompanying drawings. In making description with reference to the accompanying drawings, same reference numerals are given to same or corresponding elements and repeated description thereof is omitted.

Figure 1:
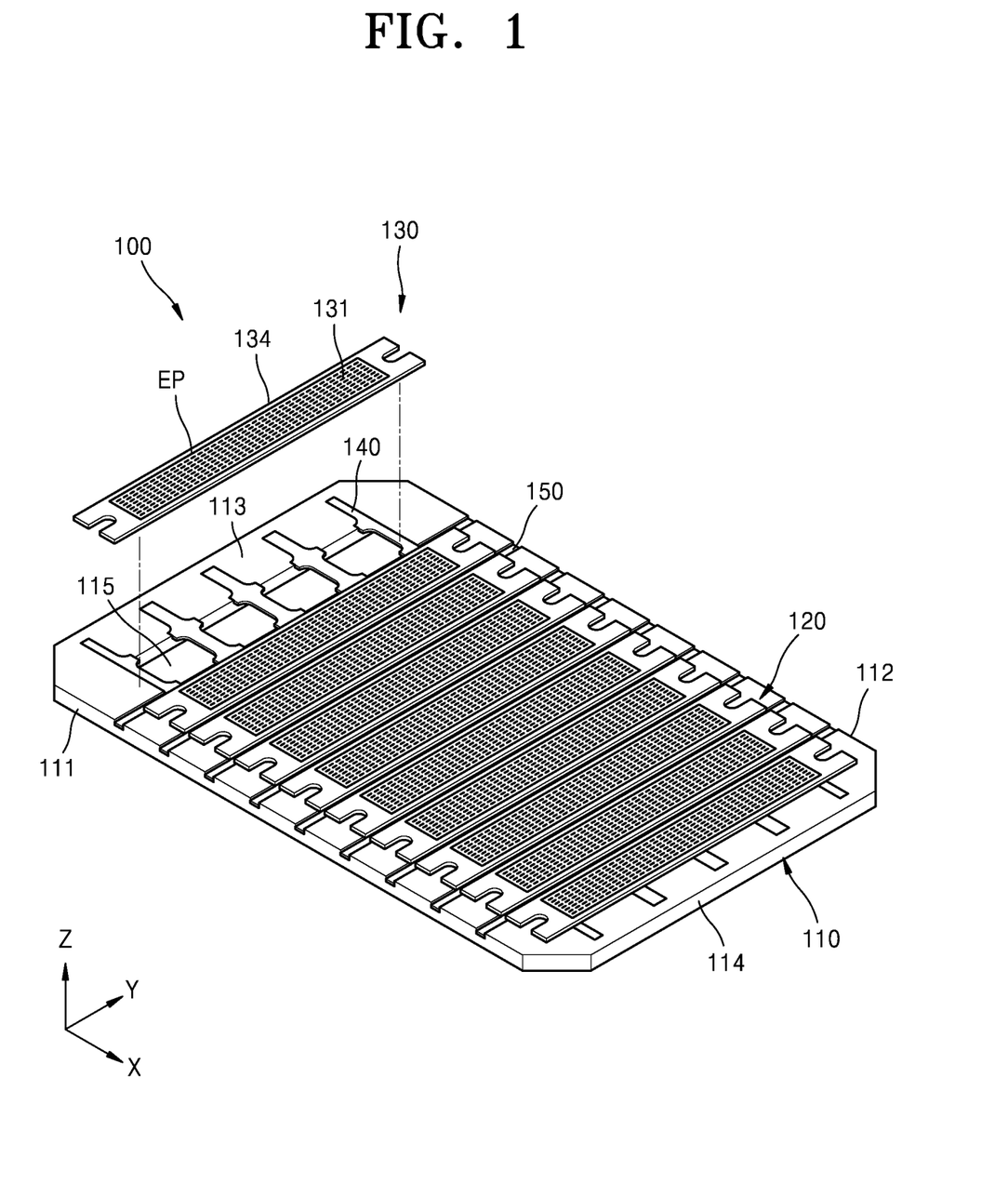
FIG. 1 is a separated perspective view of a portion of a mask frame assembly for depositing a thin film according to an embodiment.
Figure 2:
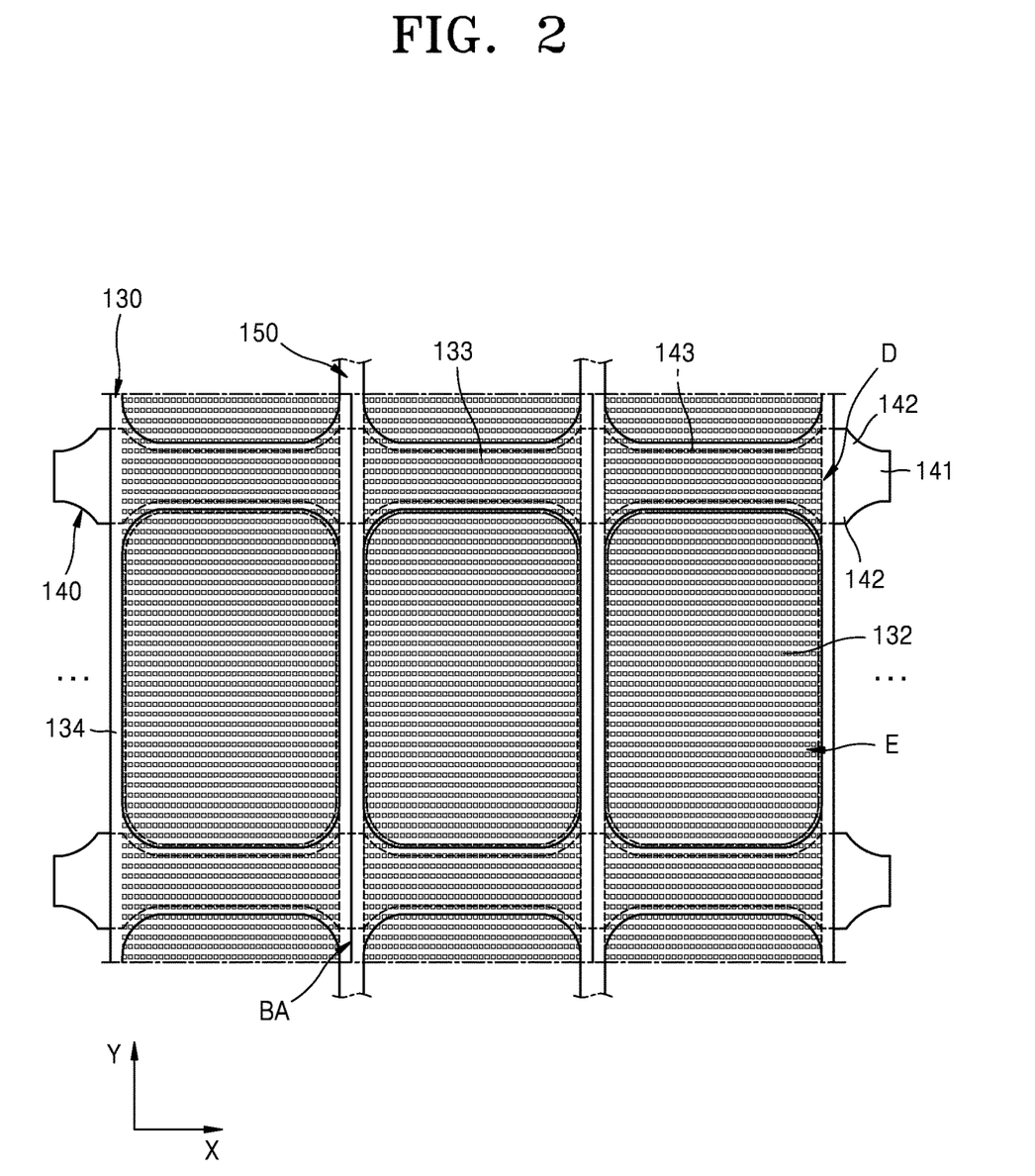
FIG. 2 is an enlarged plan view of a mask sheet, a first support stick, and a second support stick of FIG. 1.

FIG. 1 is a separated perspective view of a portion of a mask frame assembly 100 for depositing a thin film according to an embodiment, and FIG. 2 is an enlarged plan view of a mask sheet 130, a first support stick 140, and a second support stick 150 of FIG. 1.

Referring to FIGS. 1 and 2, the mask frame assembly 100 includes a mask frame 110, and a mask sheet 120 mounted on the mask frame 110.

An opening 115 may be formed in the mask frame 110. The opening 115 may be surrounded by a plurality of frames 111 to 114. The plurality of frames 111 to 114 may be connected to each other.

The plurality of frames 111 to 114 include the first frame 111 and the second frame 112 extending in a first direction (an X-direction) and facing each other in a second direction (a Y-direction), and the third frame 113 and the fourth frame 114 extending in the second direction (the Y-direction) and facing each other in the first direction (the X-direction). The first frame 111, the second frame 112, the third frame 113, and the fourth frame 114 may be connected to each other to surround the opening 115. The mask frame 110 may have a quadrangular frame shape. The mask frame 110 may include a material that is relatively less susceptible to transformation when the mask sheet 120 is welded, for example, metal having high rigidity. In an embodiment, the mask frame 110 includes at least one of stainless steel, invar, etc.

The mask sheet 120 may be coupled on the mask frame 110. The mask sheet 120 may include a thin plate. The mask sheet 120 may include at least one of stainless steel, invar, Ni, Co, a nickel alloy, a nickel-cobalt alloy, etc.

The mask sheet 120 includes the plurality of mask sheets 130 that are separated. The plurality of mask sheets 130 that are separated may be separated in the first direction (the X-direction). Each of the plurality of mask sheets 130 that are separated may extend in the second direction (the Y-direction). Hereinafter, references to the mask sheet refers to the mask sheets 130 that are separated.

A deposition pattern unit EP corresponding to a deposition pattern of a plurality of unit display panels may be arranged in the mask sheet 130. The mask sheet 130 may simultaneously deposit deposition patterns of a plurality of unit display panels. The deposition pattern unit EP may extend in the second direction (the Y-direction), which is a lengthwise direction of the mask sheet 130.

In an embodiment, a single deposition pattern unit EP may be arranged in the mask sheet 130. The single deposition pattern unit EP may be successively formed in the second direction (the Y-direction) of the mask sheet 130. In another embodiment, the mask sheet 130 may include a plurality of deposition pattern units EP respectively corresponding to deposition patterns of unit display panels. The plurality of deposition pattern units EP may be spaced apart from each other in the second direction (the Y-direction).

The deposition pattern unit EP may include a plurality of deposition areas E and a plurality of dummy areas D. The deposition areas E and the dummy areas D may be alternately arranged in the second direction (the Y-direction). One deposition area E separated by the dummy area D may correspond to a deposition area of a unit display panel. The dummy area D may correspond to a non-deposition area dividing a plurality of deposition areas E that are adjacent to each other.

Pattern holes 131 may be arranged in the deposition pattern unit EP. The pattern holes 131 include a plurality of first pattern holes 132 arranged in the deposition area E and a plurality of second pattern holes 133 arranged in the dummy area D.

The plurality of first pattern holes 132 may include holes required for forming a deposition pattern that is patterned in a display area of a unit display panel. The plurality of second pattern holes 133 may include pattern holes required for preventing transformation of the mask sheet 130 during a deposition process.

The plurality of first pattern holes 132 arranged in the deposition area E and the plurality of second pattern holes 133 arranged in the dummy area D may be alternately patterned in the lengthwise direction (the Y-direction) of the mask sheet 130. The plurality of first pattern holes 132 and the plurality of second pattern holes 133 may be successively patterned from one end of the mask sheet 130 to the other end.

The pattern holes 131 including the plurality of first pattern holes 132 and the plurality of second pattern holes 133 include a dot-shaped slit pattern or a stripe-shaped slit pattern. The plurality of first pattern holes 132 and the plurality of second pattern holes 133 have the same shape and the same size, but are not limited thereto.

A rib 134 may be arranged at two edges of the mask sheet 130 in the first direction (the X-direction), which is a width direction of the mask sheet 130. Pattern holes may not be formed in the rib 134. The rib 134 may extend in the second direction (the Y-direction), which is the lengthwise direction of the mask sheet 130.

The mask sheets 130 may be separated from each other in the first direction (the X-direction) and successively arranged. The mask sheet 130 may extend in the second direction (the Y-direction) across the opening 115 of the mask frame 110. The plurality of mask sheets 130 may cover respective openings 115. Two opposite ends of the mask sheet 130 in the second direction (the Y-direction) may be fixed on the first frame 111 and the second frame 112 by spot welding.

A plurality of first support sticks 140 may be arranged between the mask frame 110 and the mask sheet 130. The first support stick 140 may prevent the mask sheet 130 from sagging due to its own weight. The first support stick 140 may include a shield thin plate that prevents a deposition material from being deposited on an undesired area of the substrate. The first support stick 140 may include at least one of stainless steel, invar, etc.

The first support stick 140 may be arranged in a direction crossing the mask sheet 130. The first support stick 140 may extend across the plurality of mask sheets 130 that are adjacent to each other in the first direction (the X-direction).

The plurality of first support sticks 140 may be spaced apart from each other in the second direction (the Y-direction). Each of the first support sticks 140 may shield the plurality of second pattern holes 133 arranged in each of the dummy areas D. The first support stick 140 includes a first stick main body 141 extending in the first direction (the X-direction). A plurality of first protrusions 142 may protrude from the first stick main body 141 and may be spaced apart from each other in the first direction (the X-direction). The plurality of first protrusions 142 may be connected to each other by a connector 143.

The first protrusion 142 may protrude in the second direction (the Y-direction) from two opposite edges of the first stick main body 141. The first protrusion 142 may reinforce the rigidity of the first stick main body 141. As long as the first protrusion 142 protrudes from at least one edge of the first stick main body 141, the first protrusion 142 is not limited to one shape. In an embodiment, the first support stick 140 may include only the first stick main body 141 without the first protrusion 142.

Two opposite ends of the first support stick 140 may be respectively spot-welded on the third frame 113 and the fourth frame 114. Specifically, the first support stick 140 may be fixed on the third frame 113 and the fourth frame 114 with applied tensile force.

A second support stick 150 may be arranged between the mask frame 110 and the first support stick 140. In another embodiment, the second support stick 150 may be arranged between the mask sheet 130 and the first support stick 140. The first support stick 140 and the second support stick 150 may intersect with each other. The second support stick 150 may include at least one of stainless steel, invar, etc.

The second support stick 150 may be arranged in a direction in which the mask sheet 130 extends. The plurality of second support sticks 150 may be spaced apart from each other in the first direction (the X-direction). Each of the second support sticks 150 may be arranged in a boundary area BA between the plurality of mask sheets 130 that are adjacent to each other in the first direction (the X-direction). The second support stick 150 may shield an interval between the plurality of mask sheets 130 that are adjacent to each other. The second support stick 150 may overlap the rib 134 of the plurality of mask sheets 130 that are adjacent to each other. In an embodiment, a protrusion may protrude in the first direction (the X-direction) from one edge of the second support stick 150.

Two opposite ends of the second support stick 150 may be respectively spot-welded on the first frame 111 and the second frame 112. Specifically, the second support stick 150 may be fixed on the first frame 111 and the second frame 112 with applied tensile force.

Figure 3:
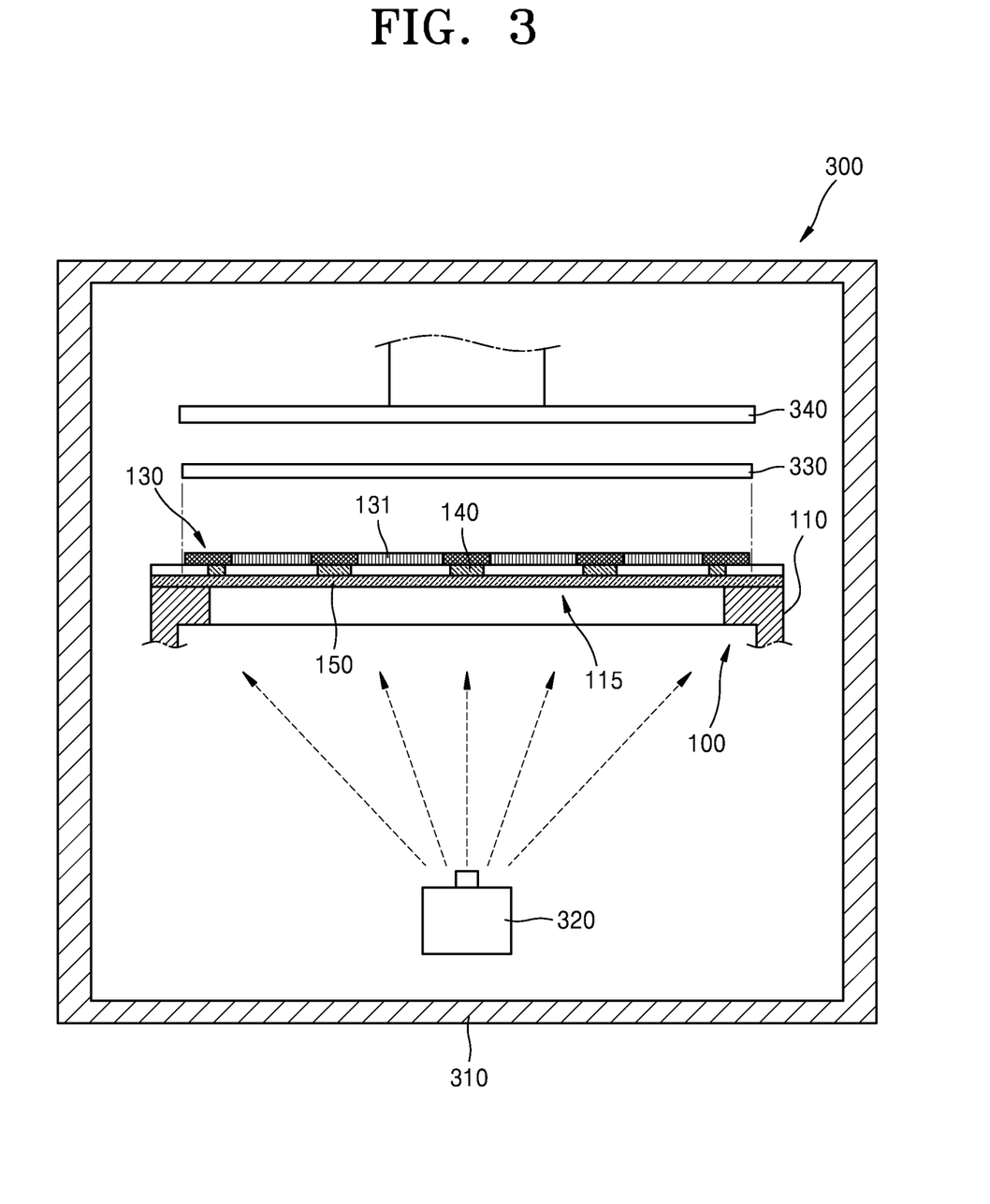
FIG. 3 is a configuration view of a deposition apparatus for performing deposition by using the mask frame assembly of FIG. 1.

FIG. 3 is a configuration view of a deposition apparatus 300 for performing deposition by using the mask frame assembly 100 for depositing a thin film of FIG. 1.

Referring to FIG. 3, the deposition apparatus 300 includes a vacuum chamber 310 configured to deposit a thin film such as an organic emission layer of an organic light-emitting display device. A deposition source 320 may be located in a lower portion inside the vacuum chamber 310. The mask frame assembly 100 may be installed above the deposition source 320. The mask sheet 130 may be installed over the mask frame assembly 100. A substrate 330 for deposition may be located over the mask sheet 130. A magnet 340 may be installed over the substrate 330 for deposition, the magnet 340 being configured to generate magnetic force such that the mask sheet 130 is closely attached on the substrate 330 for deposition.

The first support stick 140 and the second support stick 150 may be installed on a bottom surface of the mask sheet 130 to prevent sagging of the mask sheet 130. The first support stick 140 and the second support stick 150 may be arranged in directions intersecting with each other.

When a deposition material is sprayed from the deposition source 320 toward the mask sheet 130, the deposition material that progresses through the opening 115 of the mask frame 110 passes through the plurality of pattern holes 131 formed in the mask sheet 130 and is deposited to have a desired pattern on one side of the substrate 330 for deposition.

After a deposition pattern is formed on the substrate 330 for deposition, another substrate 330 for deposition is inserted in the vacuum chamber 310 and a deposition process is performed. When a deposition process is repeatedly performed dozens of times, the mask frame 110 may be transformed. Specifically, when the number of depositions increases, the first support stick 140 and the second support stick 150 may be thermally transformed due to heat generating from the deposition source 320. When the thermal transformation of the first support stick 140 and the second support stick 150 occurs, the mask frame 110, on which the first support stick 140 and the second support stick 150 have been welded, may contract or expand in the X-direction and the Y-direction. Accordingly, a deposition pattern may not be formed on a desired location of the substrate 330, and consequently, a shadow defect may occur.

The first support stick 140 and the second support stick 150 need to be designed by taking into account a mask frame transformation index that may minimize time series transformation of the mask frame 110. Specifically, since the number of depositions increases after the mask frame assembly 100 is manufactured, temperatures of the first support stick 140 and the second support stick 150 increase, and consequently, the mask frame 110, on which the first support stick 140 and the second support stick 150 have been welded, may be transformed. Therefore, the mask frame assembly 100 should be manufactured by taking into account time series change rate of the first support stick 140 and the second support stick 150.

For example, a transformation rate Df of the mask frame 110 may correspond to a value obtained by subtracting a transformation rate D2 of the second support stick 150 from a transformation rate D1 of the first support stick 140, the first support stick 140 extending in the direction (the X-direction) intersecting with the mask sheet 130, and the second support stick 150 extending in the direction (the Y-direction) that is parallel to the mask sheet 130 (Df=D1-D2).

Specifically, the materials, the number, and the size of the first support stick 140 and the second support stick 150 arranged on the mask frame 110 may be different from each other. Also, tensile forces applied to the first support stick 140 and the second support stick 150 may be different from each other. Accordingly, a difference in thermal transformation of the first support stick 140 and the second support stick 150 occurs. The difference in the thermal transformation may substantially be the transformation of the mask frame 110.

In an embodiment, restoring force R of the mask frame 110 may be proportional to resultant tensile force of the plurality of second support sticks 150 ($\Sigma$ tensile force of the second support sticks) divided by resultant tensile force of the plurality of first support sticks 140 ($\Sigma$ tensile force of the first support sticks). That is, R∝$\Sigma$ tensile force of the second support sticks/$\Sigma$ tensile force of the first support sticks).

The first support stick 140 and the second support stick 150 may be designed such that the mask frame transformation index is within a range from about −1000 to about +1000 based on Equation 1 below.

Mask frame transformation index=$\Sigma$ (tensile force of first support sticks/tensile rate of first support sticks)−$\Sigma$ (tensile force of second support sticks/tensile rate of second support sticks),  Equation 1 where tensile force is given by thickness (T)×width (W)× elastic coefficient (E)×tensile rate ($\delta/L_0$), $\delta$ is a transformed amount ($L_f-L_0$) corresponding to tension, $L_0$ is an initial length of a stick, and $L_f$ is a final length of a stick.

When the mask frame transformation index is in the range from about −1000 to about +1000, change amounts of the mask frame 110 in the X-direction (the first direction) and the Y-direction (the second direction) may change by 5 μm or less. Specifically, an entire change amount of the mask frame 110 in the first direction (the X-direction) may be 5 μm or less, and an entire change amount of the mask frame 110 in the second direction (the Y-direction) may be 5 μm or less.

When the mask frame transformation index is within the range from about −1000 to about +1000, the change amounts of the mask frame 110 in the X-direction and the Y-direction may be within an error range. That is, even when the number of depositions increases, a deposition pattern may be formed on a desired location of the substrate 330.

Thus, when the mask frame transformation index may be within the range from about −1000 to about +1000 by adjusting factors such as thicknesses, widths, lengths, materials, and change amounts by tension of the first support stick 140 and the second support stick 150 arranged on the mask frame 110, the change amounts of the mask frame 110 in the X-direction and the Y-direction may be reduced.

Figure 4:
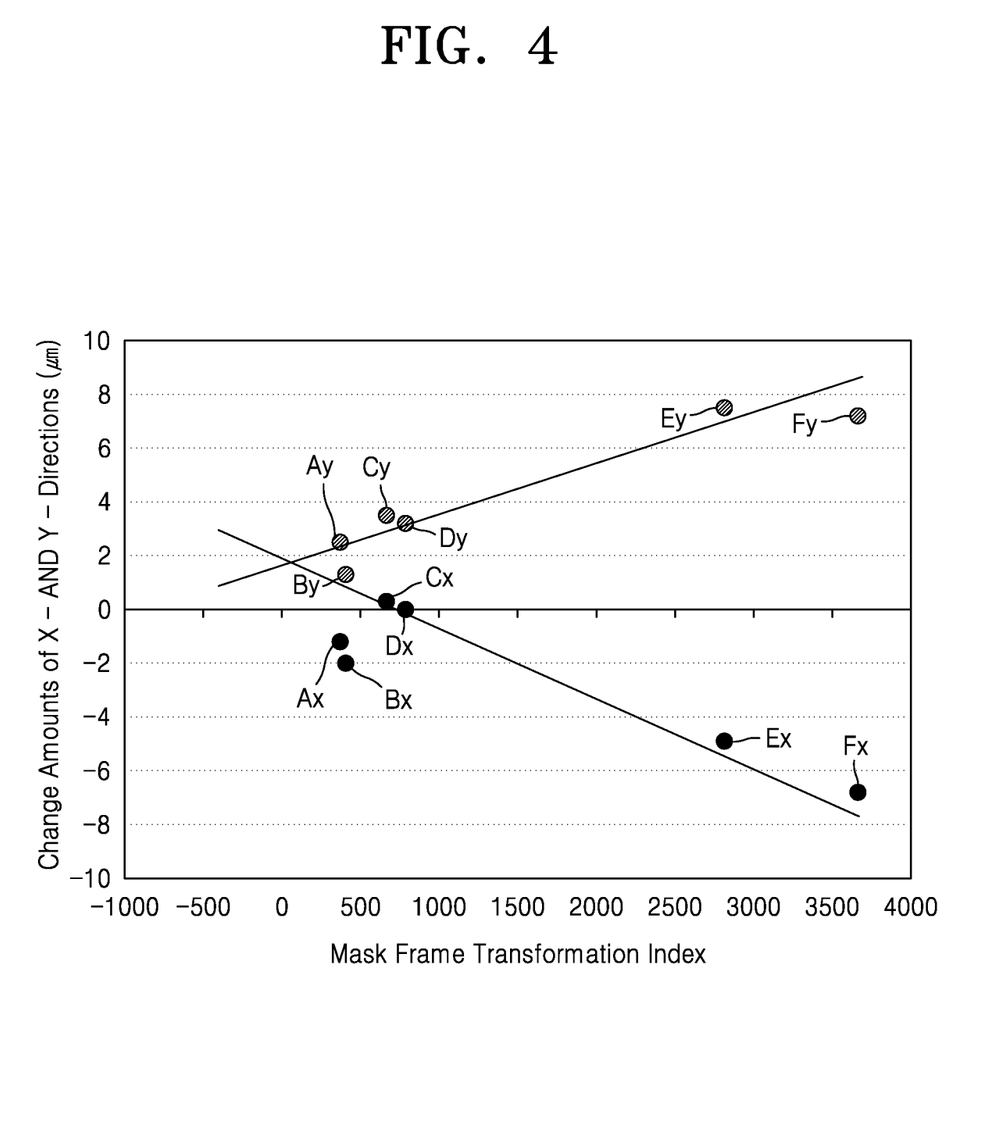
FIG. 4 is a graph of a mask frame transformation index according to an experiment of the present applicant.

Table 1 and FIG. 4 are a table and a graph showing a mask frame transformation index according to an experiment of the present applicant.

TABLE 1

| Model | Tensile rate (%) of first support stick | Tensile rate (%) of second support stick | $\Sigma$ tensile force (kgf) of first support stick | $\Sigma$ tensile force (kgf) of second support stick | Frame transformation index | X expansion (μm) | Y expansion (μm) |
|---|---|---|---|---|---|---|---|
| Embodiment A | 0.051 | 0.048 | 70 | 52 | 352.9 | −1.2 | 2.5 |
| Embodiment B | 0.051 | 0.056 | 70 | 55 | 380.5 | −2 | 1.3 |
| Embodiment C | 0.044 | 0.135 | 36 | 23.1 | 539.4 | 0.3 | 3.5 |
| Embodiment D | 0.0401 | 0.135 | 50 | 64.3 | 606.5 | 0.0 | 3.2 |
| Comparative Example E | 0.0411 | 0.135 | 120 | 16.8 | 2411. | −4.9 | 7.5 |
| Comparative Example F | 0.0186 | 0.135 | 76.5 | 62.4 | 3109. | −6.8 | 7.2 |

Referring to Table 1 and FIG. 4, a mask frame transformation index is measured by adjusting lots of variables, for example, the widths, the thicknesses, and the tensile forces of the first support stick 140 and the second support stick 150, the first support stick 140 and the second support stick 150 being welded on the mask frame 110 with applied tensile force.

Here, a negative value in the first direction (the X-direction) denotes that the mask frame 110 contracts in the X-direction, and a positive value in the second direction (the Y-direction) denotes that the mask frame 110 expands in the Y-direction. Also, the change amounts in the X-direction and the Y-direction have been measured after a deposition process has been performed forty five times.

Referring to Embodiment A, Embodiment B, Embodiment C, and Embodiment D, respective mask frame transformation indexes are 352.9, 380.5, 539.4, and 606.6, which shows that the mask frame transformation indexes are within the range from about −1000 to about +1000. In this case, it is revealed that change amounts in the X-direction Ax, Bx, Cx, and Dx are respectively −1.2 μm, −2 μm, 0.3 μm, 0.0 μm, and change amounts in the Y-direction Ay, By, Cy, and Dy are respectively 2.5 μm, 1.3 μm, 3.5 μm, 3.2 μm. The mask frame 110 having such change amounts in the X-direction and the Y-direction is usable during a deposition process.

In contrast, referring to Comparative Examples E and F, mask frame transformation indexes are respectively 2411.1 and 3109.5, which shows that the mask frame transformation indexes have deviated from the range from about −1000 to about +1000. In this case, it is known that change amounts in the X-direction (Ex and Fx) are respectively−4.9 μm and −6.8 μm, and change amounts in the Y-direction (Ey and Fy) are respectively 7.5 μm and 7.2 μm. Since the mask frame 110 having the change amounts in the X-direction and the Y-direction like this causes a shadow defect, the mask frame 110 cannot be used during a deposition process.

As described above, in Embodiments A, B, C, and D in which the mask frame transformation indexes are within the range from about −1000 to about +1000, change amounts of the mask frame 110 in the X-direction and the Y-direction due to thermal changes of the first support stick 140 and the second support stick 150 are 5 μm or less, which is an error range.

Table 2 shows a mask frame transformation index according to an experiment of the present applicant.

TABLE 2

| model | Tensile force (kgf) of first support stick | Tensile force (kgf) of second support stick | Tensile rate (%) of first support stick | Tensile rate (%) of second support stick | Thickness (μm) of first support stick | Thickness (μm) of second support stick | Entire force | Frame transformation index |
|---|---|---|---|---|---|---|---|---|
| Comparative example | 8.5 | 5.2 | 0.018 | 0.135 | 100 | 50 | 138.9 | 311 |
| Embodiment | 8.5 | 5.2 | 0.037 | 0.067 | 50 | 100 | 138.9 | 861 |

Referring to Table 2, in the Comparative example, a mask frame transformation index is 311 with thicknesses, tensile forces, etc. of the first support stick 140 and the second support stick 150 adjusted. In the Embodiment, a mask frame transformation index is 861 with thicknesses, tensile forces, etc. of the first support stick 140 and the second support stick 150 adjusted. In this case, the mask assembly 100 has been measured after temperature rises by 20° C.

Table 3 shows change amounts of the mask frame 110 in the X-direction and the Y-direction according to the mask frame transformation index of Table 2.

TABLE 3

| Model | X expansion (μm) | Improvement rate (%) of X direction | Y expansion (μm) | Improvement rate (%) of Y direction |
|---|---|---|---|---|
| Comparative Example | −6.8 | — | 7.2 | — |
| Embodiment | 0.3 | 104.4 | 3.7 | 48.6 |

Referring to Table 3, change amounts of the mask frame 110 of the Comparative Example in the X-direction and the Y-direction are respectively−6.8 μm and 7.2 μm. In contrast, change amounts of the mask frame 110 of the Embodiment in the X-direction and the Y-direction are respectively 0.3 μm and 3.7 μm.

It is revealed that in the Embodiment in which a mask frame transformation index is within the range from about −1000 to about +1000, transformation of the mask frame 110 is reduced compared to in the Comparative Example.

Accordingly, during a deposition process, even when the mask frame 110 is transformed by thermal transformation of the first support stick 140 and the second support stick 150, deposition may be performed on a desired area of the substrate 330 for deposition.

Figure 5:
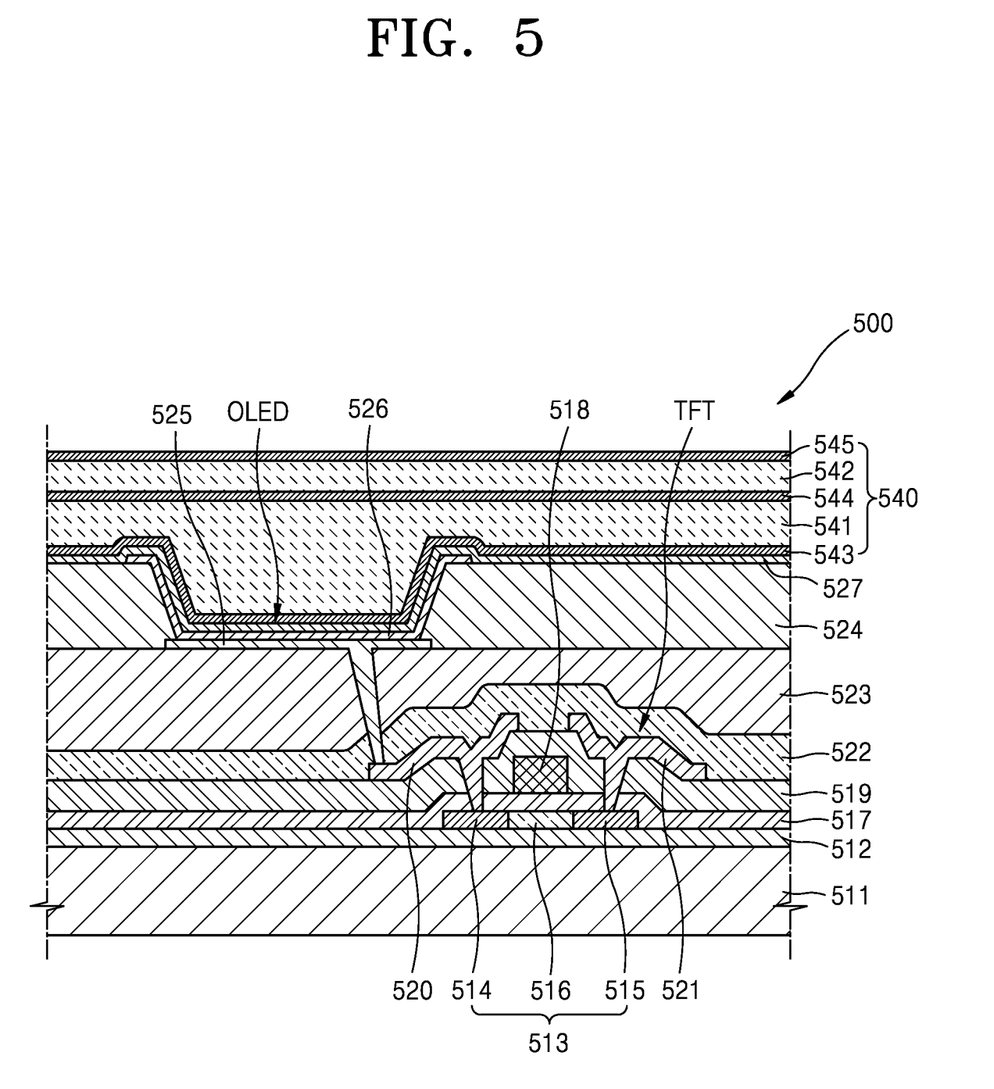
FIG. 5 is a cross-sectional view of one sub-pixel of an organic light-emitting display device that is deposited by using the mask frame assembly of FIG. 1.

FIG. 5 is a cross-sectional view of one sub-pixel of an organic light-emitting display device 500 that is deposited by using the mask frame assembly 100 of FIG. 1.

Here, sub-pixels include at least one thin film transistor TFT and an organic light-emitting diode OLED. The thin film transistor TFT is not limited to only a structure of FIG. 5 and the number and the structure of thin film transistors may be variously changed.

Referring to FIG. 5, the organic light-emitting display device 500 includes a substrate 511. The substrate 511 includes a glass substrate, a plastic substrate, or a flexible film substrate. The substrate 511 may be transparent, semi-transparent, or opaque.

A barrier layer 512 may be arranged on the substrate 511. The barrier layer 512 may cover a top surface of the substrate 511. The barrier layer 512 may include an inorganic layer or an organic layer. The barrier layer 512 may include a single layer or a multi-layer.

The thin film transistor TFT may be formed on the barrier layer 512. Though the thin film transistor TFT according to the present embodiment may be a top gate-type thin film transistor as an example, a thin film transistor having a different structure such as a bottom gate-type thin film transistor may be provided.

A semiconductor layer 513 may be arranged on the barrier layer 512. The semiconductor layer 513 may include a source region 514 and a drain region 515 doped with N-type or P-type impurity ions. A region between the source region 514 and the drain region 515 may include a channel region 516 not doped with impurities.

The semiconductor layer 513 may include an organic semiconductor, an inorganic semiconductor, or amorphous silicon. In another embodiment, the semiconductor layer 513 may include an oxide semiconductor.

A gate insulating layer 517 may be deposited on the semiconductor layer 513. The gate insulating layer 517 may include an inorganic layer. The gate insulating layer 517 may include a single layer or a multi-layer.

A gate electrode 518 may be arranged on the gate insulating layer 517. The gate electrode 518 may include a single layer or a multi-layer including at least one of Au, Ag, Cu, Ni, Pt, Pd, Al, Mo, and Cr, or an alloy such as Al: Nd and Mo: W.

An interlayer insulating layer 519 may be arranged on the gate electrode 518. The interlayer insulating layer 519 may include an inorganic layer including a silicon oxide or a silicon nitride.

A source electrode 520 and a drain electrode 521 may be arranged on the interlayer insulating layer 519. Contact holes are formed by removing a portion of the gate insulating layer 517 and a portion of the interlayer insulating layer 519. The source electrode 520 may be electrically connected to the source region 514, and the drain electrode 521 may be electrically connected to the drain region 515 through the contact holes.

A passivation layer 522 may be formed on the source electrode 520 and the drain electrode 521. The passivation layer 522 may include an inorganic layer or an organic layer.

A planarization layer 523 may be formed on the passivation layer 522. The planarization layer 523 may include an organic layer including an acrylic, a polyimide, and benzocyclobutene (BCB). In an embodiment, the passivation layer 522 and the planarization layer 523 may each include a single layer or a multi-layer.

The organic light-emitting diode OLED may be arranged over the thin film transistor TFT.

The organic light-emitting diode OLED includes a pixel electrode 525, which is a first electrode, an opposite electrode 527, which is a second electrode, and an intermediate layer 526 between the pixel electrode 525 and the opposite electrode 527.

The pixel electrode 525 is electrically connected to one of the source electrode 520 and the drain electrode 521 through a contact hole.

The pixel electrode 525 serves as an anode and may include various conductive materials. The pixel electrode 525 may include a transparent electrode or a reflective electrode.

A pixel-defining layer (PDL) 524 covering edges of the pixel electrode 525 may be arranged on the planarization layer 523. The pixel-defining layer 524 defines an emission area of each sub-pixel by surrounding the edges of the pixel electrode 525.

The pixel-defining layer 524 may include an organic layer.

The intermediate layer 526 may be arranged on an area of the pixel electrode 525 exposed by etching a portion of the pixel-defining layer 524. The intermediate layer 526 may be formed by a deposition process.

The intermediate layer 526 may include a low molecular weight organic material or a polymer organic material.

The intermediate layer 526 may include an organic emission layer (EML). In another embodiment, the intermediate layer 526 may include an organic emission layer and further include at least one of a hole injection layer (HIL), a hole transport layer (HTL), an electron transport layer (ETL), and an electron injection layer (EIL). The present embodiment is not limited thereto, and the intermediate layer 526 may include an organic emission layer and further include other various functional layers.

The opposite electrode 527 may be arranged on the intermediate layer 526. The opposite electrode 527 may correspond to a common electrode. Like the pixel electrode 525, the opposite electrode 527 may include a transparent electrode or a reflective electrode.

The pixel electrode 525 and the opposite electrode 527 may be insulated from each other by the intermediate layer 526. When a voltage is applied to the pixel electrode 525 and the opposite electrode 527, the intermediate layer 526 emits visible light and an image recognizable by a user is produced.

An encapsulation unit 540 may be arranged on the organic light-emitting diode OLED.

The encapsulation unit 540 may include a plurality of organic layers 541 and 542 and a plurality of inorganic layers 543, 544, and 545 that are alternately stacked. In an embodiment, the encapsulation unit 540 may have a structure in which the organic layers 541 and 542 include at least one layer and the inorganic layers 543, 544, and 545 include at least two layers. The inorganic layer 545, which is an uppermost layer exposed to the outside, of the encapsulation unit 540 may include an inorganic layer so as to prevent moisture transmission to the organic light-emitting diode OLED.

Figure 6:
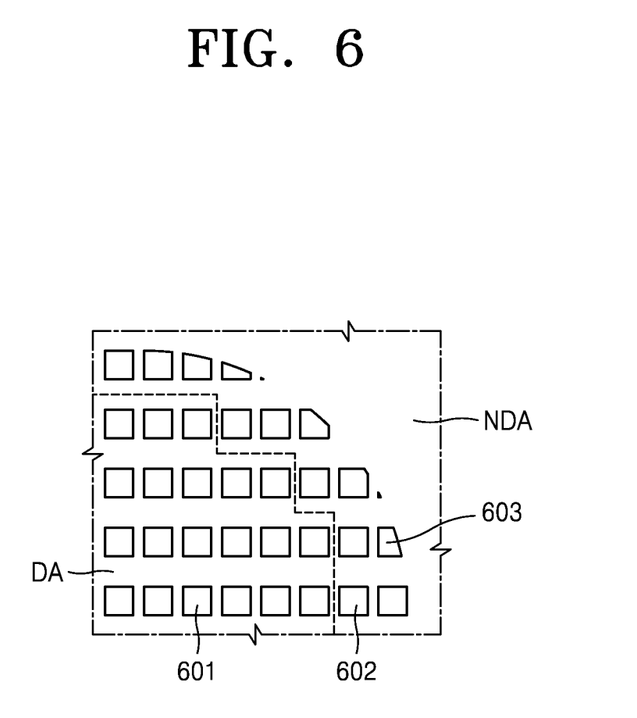
FIG. 6 is an enlarged view of a deposition pattern deposited on a substrate by using the mask frame assembly of FIG. 1.

FIG. 6 is an enlarged view of a deposition pattern deposited on a substrate by using the mask frame assembly 100 of FIG. 1.

Referring to FIG. 6, a deposition material that has evaporated from the deposition source 320 (see FIG. 5) passes through the pattern holes 131 of the mask sheet 130, and then, is deposited on a display area DA of the substrate 330 (see FIG. 5). Accordingly, a pattern 601 of an organic emission layer may be formed in the display area DA. The pattern 601 deposited in the display area DA may emit light when driven.

A dummy pattern 602 is deposited in a non-display area NDA extending to the outside of the display area DA. Some dummy patterns 602 include a broken pattern 603 due to a shadow phenomenon, etc. The dummy pattern 602 is not substantially involved in emitting light.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A mask frame assembly comprising:
a mask frame including an opening and a plurality of frames surrounding the opening;
at least one mask sheet in which a plurality of deposition holes are patterned, the at least one mask sheet being arranged on the mask frame;
a plurality of first support sticks extending in a first direction; and
a plurality of second support sticks extending in a second direction,
wherein a mask frame transformation index of the plurality of first support sticks and the plurality of second support sticks is within a range from about −1000 to about +1000 based on Equation 1 below:

Equation 1 mask frame transformation index=Σ (tensile force of a first support stick among the plurality of first support sticks/tensile rate of the first support stick) Σ (tensile force of a second support stick among the plurality of second support sticks/ tensile rate of the second support stick).

2. The mask frame assembly of claim 1, wherein each of the first support sticks includes a first stick main body and at least two protrusions protruding from two opposite edges of the first stick main body in the second direction and spaced apart from each other in the first direction, and
wherein the at least two protrusions overlap at least one of the plurality of second support sticks and a boundary area of two adjacent mask sheets.

3. The mask frame assembly of claim 1, wherein the first direction of the mask frame corresponds to a direction in which each of the plurality of first support sticks extends, and a change in length of the mask frame in the first direction is 5 μm or less.

4. The mask frame assembly of claim 1, wherein the second direction of the mask frame corresponds to a direction in which each of the plurality of second support sticks extends, and a change in length of the mask frame in the second direction is 5 μm or less.

* * * * *